United States Patent
Wang et al.

(10) Patent No.: US 10,026,927 B2
(45) Date of Patent: Jul. 17, 2018

(54) AUXILIARY SPREADING LAYER IN A THIN FILM PACKAGE FOR AN ORGANIC LIGHT EMITTING DIODE

(71) Applicant: BOE TECHNOLOGY GROUP CO., LTD., Beijing (CN)

(72) Inventors: Youwei Wang, Beijing (CN); Song Zhang, Beijing (CN); Peng Cai, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/228,657

(22) Filed: Aug. 4, 2016

(65) Prior Publication Data

US 2017/0279080 A1 Sep. 28, 2017

(30) Foreign Application Priority Data

Mar. 23, 2016 (CN) .......................... 2016 1 0168518

(51) Int. Cl.
  *H01L 29/08* (2006.01)
  *H01L 21/00* (2006.01)
  *H01L 51/52* (2006.01)
  *H01L 51/56* (2006.01)

(52) U.S. Cl.
  CPC .......... *H01L 51/5256* (2013.01); *H01L 51/56* (2013.01); *H01L 2251/301* (2013.01); *H01L 2251/5338* (2013.01)

(58) Field of Classification Search
  CPC .................... H01L 51/5256; H01L 51/56
  See application file for complete search history.

(56) References Cited

U.S. PATENT DOCUMENTS

| | | | |
|---|---|---|---|
| 2013/0207083 A1* | 8/2013 | Young | H01L 51/5237 257/40 |
| 2015/0048331 A1* | 2/2015 | Kwack | H01L 51/5253 257/40 |
| 2015/0108435 A1* | 4/2015 | Huh | H01L 51/5256 257/40 |
| 2015/0171369 A1 | 6/2015 | Xie | |
| 2016/0260929 A1* | 9/2016 | Oh | H01L 51/56 |
| 2016/0283005 A1* | 9/2016 | Lee | G06F 3/0412 |
| 2016/0336542 A1* | 11/2016 | Chen | H01L 21/67167 |

FOREIGN PATENT DOCUMENTS

CN 103430345 A 12/2013

OTHER PUBLICATIONS

China First Office Action, Application No. 201610168518.5, dated Mar. 23, 2018, 16 pps. with English translation.

* cited by examiner

*Primary Examiner* — Alonzo Chambliss
(74) *Attorney, Agent, or Firm* — Armstrong Teasdale LLP (57) ABSTRACT

A thin film package structure is provided. The thin film package structure includes a plurality of film layers arranged on the outside of a device, the plurality of film layers including inorganic and organic layers alternately laminated, wherein the innermost film layer and the outermost film layer among the plurality of film layers are inorganic layers, and an auxiliary spreading layer arranged between at least one pair of an inorganic layer and an organic layer adjacent within the plurality of film layers, wherein the hydrophilicity-hydrophobicity of the auxiliary spreading layer is the same as that of the organic layer in contact with the auxiliary spreading layer.

17 Claims, 5 Drawing Sheets

AUXILIARY SPREADING LAYER IN A THIN FILM PACKAGE FOR AN ORGANIC LIGHT EMITTING DIODE

CROSS-REFERENCE TO RELATED APPLICATION

This application claims priority of Chinese Patent Application No. 201610168518.5, which was filed on Mar. 23, 2016, the disclosure of which is incorporated herein by reference in its entirety.

BACKGROUND

The present disclosure relates to the field of displaying device package technology, in particular, to a thin film package structure and a display apparatus.

Organic Light-Emitting Diode (OLED) devices have been widely applied in the field of display, in virtue of their advantages such as active lighting, high brightness, wide view angle, fast response time, flexible displaying and so forth. However, components such as water and oxygen in the air impose adverse effect on life span of OLED devices significantly. As a result, it is common that OLED devices are packaged by using thin film package structures, such that the OLED can be isolated from the components such as water and oxygen in the air, thereby prolonging the life span of the OLED devices. Usually the OLED devices are referred to as devices to be packaged during a package process on the OLED devices.

In the related art, such a thin film package structure includes a plurality of film layers arranged on the outside of a device to be packaged, the plurality of film layers including inorganic layers and organic layers alternately laminated, and the innermost film layer and the outermost film layer among the plurality of film layers are inorganic layers. The inorganic layers are usually made of a Silicon Nitride (SiNx) material, and formed by a Chemical Vapor Deposition (CVD) process, whose main role is to isolate the device to be packaged from outside air. On the other hand, the organic layers are usually made of organic materials such as acrylate and epoxy resin, and formed by an Ink-Jet Printing (IJP) process, whose main role is to fill in cracks and defects on the inorganic layers, thereby facilitating the inorganic layers better to isolate the device to be packaged from outside air. Specifically, in the course of the IJP process, an ink-jet printing device is first provided with IJP Ink by conducting a particular process on organic materials, and then sprays the IJP Ink onto the inorganic layers, such that IJP Ink spreads on the inorganic layers to form an organic layer.

However, Inventors of the present disclosure found out the following problems existed in the above relate art. Because the SiNx material is a hydrophilic material and organic materials such as acrylate and epoxy resin are hydrophobic materials, hydrophilicity-hydrophobicity of the organic layers formed by organic materials such as acrylate and epoxy resin is different from that of the inorganic layers formed by the SiNx material. As a result, the IJP Ink can hardly spread on the inorganic layers effectively. Therefore, the spreadability of IJP Ink on the inorganic layers is unsatisfactory, in the mean time its filling effect on cracks and defects on the inorganic layers by the organic layers deteriorates.

BRIEF DESCRIPTION

The present disclosure provides in some embodiments a thin film package structure and a display apparatus to solve the above addressed technical problems.

In a first aspect, embodiments of the present disclosure provide a thin film package structure including a plurality of film layers arranged on the outside of a device, the plurality of film layers including inorganic layers and organic layers alternately laminated, wherein the innermost film layer and the outermost film layer among the plurality of film layers are inorganic layers, and an auxiliary spreading layer arranged between at least one pair of inorganic layer and organic layer adjacent to each other among the plurality of film layers, wherein the hydrophilicity-hydrophobicity of the auxiliary spreading layer is the same as that of the organic layer in contact with the auxiliary spreading layer.

In one possible embodiment, the auxiliary spreading layer is formed between a first inorganic layer that is a film layer in contact with the device and a first organic layer that is an organic layer in contact with the first inorganic layer.

In one possible embodiment, among the plurality of film layers, except for the outermost inorganic layer, each of the inorganic layers in contact with a corresponding organic layer is provided with an auxiliary spreading layer at its side far away from the device, wherein the hydrophilicity-hydrophobicity of the auxiliary spreading layers are the same as those of the organic layers in contact with the auxiliary spreading layers.

In one possible embodiment, the hydrophilicity-hydrophobicity of the organic layer is hydrophobicity, while the hydrophilicity-hydrophobicity of the auxiliary spreading layer is hydrophobicity.

In one possible embodiment, the auxiliary spreading layer includes a self-assembled non-polar hydrophobic monolayer.

In one possible embodiment, the auxiliary spreading layer is made of at least one of propyltrichlorosilane, octadecyltrichlorosilane, and methoxy ethoxy silane.

In one possible embodiment, a process for forming the auxiliary spreading layer includes at least one of evaporation and Chemical Vapor Deposition (CVD).

In one possible embodiment, the plurality of film layers includes two inorganic layers and one organic layer arranged therebetween.

In one possible embodiment, the inorganic layer is made of SiNx, and the organic layer is made of at least one of acrylate and epoxy resin.

In one possible embodiment, the device includes an Organic Light-Emitting Diode (OLED) device, which is arranged at a display region on the substrate, and the display region is overlaid by both the inorganic layer and the organic layer.

In one possible embodiment, a flexible base layer is formed on the substrate, the OLED device is arranged at a corresponding region of the flexible base layer corresponding to the display region, and the corresponding region of the flexible base layer is overlaid by both the inorganic layer and the organic layer.

In a second aspect, embodiments of the present disclosure provide a display apparatus including OLED devices and a thin film package structure according to the first aspect of the embodiments of the present disclosure.

In a third aspect, embodiments of the present disclosure provide a method for fabricating a thin film package structure including providing a device, arranging a plurality of film layers on the outside of the device, wherein the plurality of film layers includes inorganic layers and organic layers alternately laminated, and wherein the innermost film layer and the outermost film layer among the plurality of film layers are inorganic layers, and arranging an auxiliary spreading layer between at least one pair of inorganic layer and organic layer adjacent to each other among the plurality of film layers, wherein the hydrophilicity-hydrophobicity of the auxiliary spreading layer is the same as that of the organic layer in contact with the auxiliary spreading layer.

In one possible embodiment, the method further includes forming a first inorganic layer on a substrate where the device is formed, forming the auxiliary spreading layer on the first inorganic layer, forming a first organic layer on the auxiliary spreading layer, and forming a second inorganic layer on the first organic layer.

In one possible embodiment, the step of arranging the auxiliary spreading layer includes arranging an auxiliary spreading layer between every pair of the organic layer and the inorganic layer adjacent to each other, wherein the hydrophilicity-hydrophobicity of the auxiliary spreading layer is the same as that of the organic layer in contact with the auxiliary spreading layer.

In one possible embodiment, the hydrophilicity-hydrophobicity of the organic layer is hydrophobicity, while the hydrophilicity-hydrophobicity of the auxiliary spreading layer is hydrophobicity.

In one possible embodiment, the auxiliary spreading layer includes a self-assembled non-polar hydrophobic monolayer.

In one possible embodiment, the device includes an Organic Light-Emitting Diode (OLED) device, which is arranged at a display region on a substrate, and the display region is overlaid by both the inorganic layers and the organic layers alternately laminated.

In one possible embodiment, the method further includes forming a flexible base layer on the substrate, forming a first inorganic layer on the flexible base layer, forming the auxiliary spreading layer on the first inorganic layer, forming a first organic layer on the auxiliary spreading layer, and forming a second inorganic layer on the first organic layer.

In a fourth aspect, embodiments of the present disclosure provide a method for fabricating a display apparatus including the above method for fabricating a thin film package structure.

According to the thin film package structure and the display device, the thin film package structure includes a plurality of film layers arranged on the outside of a device, the plurality of film layers including inorganic layers and organic layers alternately laminated, wherein the innermost film layer and the outermost film layer among the plurality of film layers are inorganic layers, and an auxiliary spreading layer arranged between at least one pair of inorganic layer and organic layer adjacent to each other among the plurality of film layers, wherein the hydrophilicity-hydrophobicity of the auxiliary spreading layer is the same as that of the organic layer in contact with the auxiliary spreading layer. In one possible embodiment, the auxiliary spreading layer whose hydrophilicity-hydrophobicity is the same as that of a first organic layer is formed between a first inorganic layer that is a film layer in contact with the device and the first organic layer that is an organic layer in contact with the first inorganic layer. As a result, due to the fact that the hydrophilicity-hydrophobicity of the auxiliary spreading layer is the same as that of the first organic layer, IJP Ink that is used to form the first organic layer is apt to spread on the first inorganic layer effectively. Therefore IJP Ink is good at spreadability on the first inorganic layer and filling effect on cracks and defects on and/or in inorganic layers, which results in solving the technical problem of unsatisfactory filling effect on cracks and defects on and/or in inorganic layers by means of organic layers, and achieving a much improved filling effect on cracks and defects on and/or in inorganic layers by means of organic layers.

It should be appreciated that the above summary and the following detailed description are only for illustrative purpose, and not used to limit the present disclosure.

BRIEF DESCRIPTION OF THE DRAWINGS

In order to illustrate the technical solutions of the present disclosure or the related art in a more apparent manner, the drawings desired for the embodiments of the present disclosure will be described briefly hereinafter. Obviously, the following drawings merely relate to some embodiments of the present disclosure, and based on these drawings, a person skilled in the art may obtain the other drawings without any creative effort.

All the drawings are incorporated into the specification so as to better illustrate embodiments of the present disclosure, and are used to explain principles and spirits of the present disclosure along with the specification.

DETAILED DESCRIPTION

In order to make the advantages of the present disclosure more apparent, the present disclosure will be described hereinafter in a clear and complete manner in conjunction with the drawings and embodiments. Obviously, the following embodiments are merely a part of, rather than all of, the embodiments of the present disclosure, and based on these embodiments, a person skilled in the art may obtain the other embodiments, which also fall within the scope of the present disclosure.

Unless otherwise defined, any technical or scientific terms used herein shall have the common meaning understood by a person of ordinary skills. Such words as "first" and "second" used in the specification and claims are merely used to differentiate different components rather than to represent any order, number or importance.

For purposes of the description hereinafter, the terms "upper", "lower", "right", "left", "vertical", "horizontal", "top", "bottom", and derivatives thereof shall relate to the invention, as it is oriented in the drawing figures. The terms "overlying", "atop", "positioned on" or "positioned atop" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

As used herein and in the appended claims, the singular form of a word includes the plural, and vice versa, unless the context clearly dictates otherwise. Thus, the references "a", "an", and "the" are generally inclusive of the plurals of the respective terms. Similarly, the words "comprise", "comprises", and "comprising" are to be interpreted inclusively rather than exclusively. Likewise, the terms "include", "including" and "or" should all be construed to be inclusive, unless such a construction is clearly prohibited from the context. Where used herein the term "examples," particularly when followed by a listing of terms is merely exemplary and illustrative, and should not be deemed to be exclusive or comprehensive.

Figure 1A:
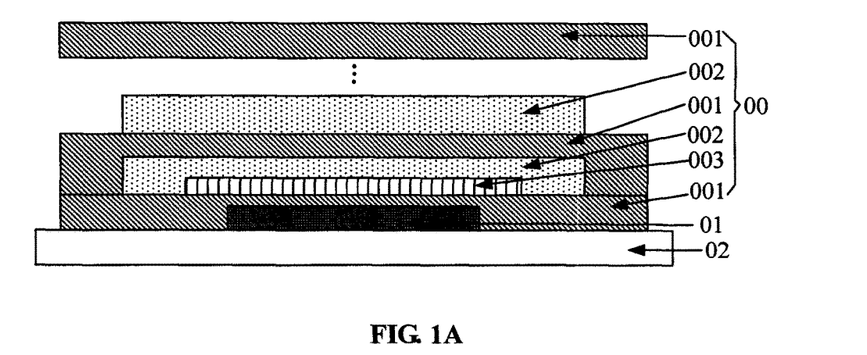
FIGS. 1A and 1B are diagrams illustrating the arrangement of a thin film package structure according to embodiments of the present disclosure.

FIG. 1A is a diagram illustrating the arrangement of a thin film package structure 00 according to embodiments of the present disclosure. As shown in FIG. 1A, the thin film package structure 00 includes a plurality of film layers arranged on the outside of a device 01 (i.e., a device to be packaged). The plurality of film layers includes inorganic layers 001 and organic layers 002 alternately laminated. Among the plurality of film layers, the innermost film layer and the outermost film layer are inorganic layers 001. Specifically, as shown in FIG. 1A, the device to be packaged 01 is arranged on the substrate 02.

As shown in FIG. 1A, among the plurality of film layers, the film layer that is in contact with the device to be packaged 01 is referred as to a first inorganic layer 001, while the organic layer in contact with the first inorganic layer 001 is referred to as a first organic layer 002. An auxiliary spreading layer 003 is formed between the first inorganic layer 001 and the first organic layer 002, whose hydrophilicity-hydrophobicity is the same as that of the first organic layer 002.

It should be noted that the arrangement shown in FIG. 1A is only for illustrative purpose. In embodiments of the present disclosure, the auxiliary spreading layer is not limited to being arranged between the first inorganic layer and the first organic layer. The auxiliary spreading layer may well be arranged between any pair of inorganic layer and organic layer adjacent to each other. And the number of the auxiliary spreading layers is not limited to one. In other words, an auxiliary spreading layer is arranged between at least one pair of inorganic layer and organic layer adjacent to each other among the plurality of film layers, wherein the hydrophilicity-hydrophobicity of the auxiliary spreading layer is the same as that of the organic layer in contact with the auxiliary spreading layer.

Figure 1B:
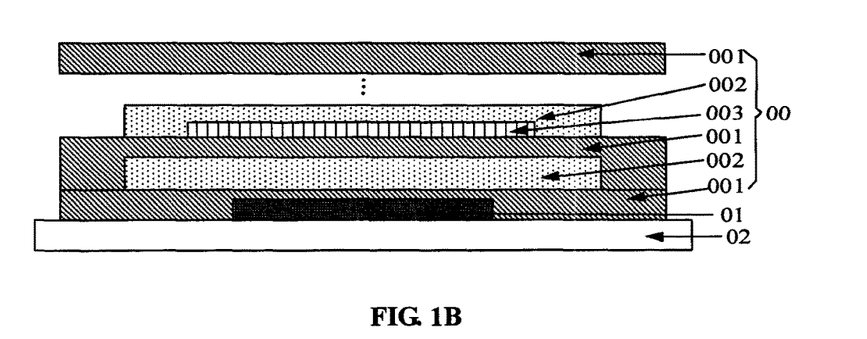

FIG. 1B is a diagram illustrating the arrangement of a thin film package structure 00 according to another embodiment of the present disclosure. As shown in FIG. 1B, the thin film package structure 00 includes a plurality of film layers arranged on the outside of a device 01 (i.e., a device to be packaged). The plurality of film layers includes inorganic layers 001 and organic layers 002 alternately laminated. Among the plurality of film layers, the innermost film layer and the outermost film layer are inorganic layers 001. Specifically, as shown in FIG. 1B, the device to be packaged 01 is arranged on the substrate 02.

As different from FIG. 1A, the auxiliary spreading layer 003 is not arranged between the first organic layer and the first inorganic layer, as shown in FIG. 1B. Here, the inorganic layer arranged on the first organic layer and in contact with the first organic layer is referred to as a second inorganic layer 001, while the organic layer arranged on the second inorganic layer and in contact with the second inorganic layer is referred to as a second organic layer 002. The hydrophilicity-hydrophobicity of the auxiliary spreading layer 003 is the same as that of the second organic layer 002.

As such, according to the thin film package structure provided by embodiments of the present disclosure, due to the fact that an auxiliary spreading layer is formed between an inorganic layer and an organic layer and the hydrophilicity-hydrophobicity of the auxiliary spreading layer is the same as that of the organic layer, IJP Ink that is used to form the organic layer is apt to spread on the inorganic layer effectively. Therefore IJP Ink is good at spreadability on the inorganic layer and filling effect on cracks and defects on and/or in inorganic layers, which results in solving the technical problem of unsatisfactory filling effect of cracks and defects on and/or inorganic layers by means of organic layers, and achieving a much improved filling effect on cracks and defects on and/or inorganic layers by means of organic layers.

Figure 2:
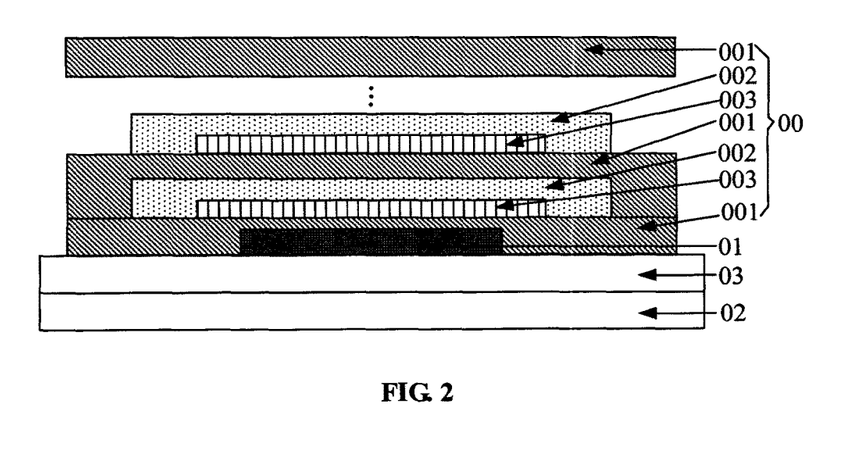
FIG. 2 is a diagram illustrating the arrangement of another thin film package structure according to embodiments of the present disclosure.

FIG. 2 is a diagram illustrating the arrangement of another thin film package structure 00 according to embodiments of the present disclosure. As shown in FIG. 2, the thin film package structure 00 includes a plurality of film layers arranged on the outside of a device to be packaged 01. The plurality of film layers includes inorganic layers 001 and organic layers 002 alternately laminated. Among the plurality of film layers, the innermost film layer and the outermost film layer are inorganic layers 001.

Specifically, as shown in FIG. 2, the device to be packaged 01 is arranged on the substrate 02. Among the plurality of film layers, except for the outermost inorganic layer 001, inorganic layers 001 each in contact with one corresponding organic layer 002 are provided with one auxiliary spreading layer 003 at its side far away from the device 01, wherein the hydrophilicity-hydrophobicity of the auxiliary spreading layers 003 are the same as those of the organic layers 002 in contact with the auxiliary spreading layers 003. For example, the polarity of the auxiliary spreading layer 003 is the same as that of the organic layer 002 in contact with the auxiliary spreading layer 003, such that the hydrophilicity-hydrophobicity of the auxiliary spreading layer 003 is the same as that of the organic layer 002 in contact with the auxiliary spreading layer 003 too. Alternatively, the polarity of all organic layers 002 within the thin film package structure 00 are the same, such that the hydrophilicity-hydrophobicity of all organic layers 002 are the same too. For example, the hydrophilicity-hydrophobicity of the organic layer 002 is hydrophobicity, while the hydrophilicity-hydrophobicity of the auxiliary spreading layer 003 is hydrophobicity.

In one possible embodiment, each of the auxiliary spreading layers 003 is a self-assembled non-polar hydrophobic monolayer, so as to facilitate filming process of the auxiliary spreading layers 003. Each of the auxiliary spreading layers 003 is made of at least one of propyltrichlorosilane, octadecyltrichlorosilane, and methoxy ethoxy silane. A process of forming the auxiliary spreading layer 003 is not limited in the embodiments of the present disclosure. For example, a process for forming the auxiliary spreading layer 003 includes at least one of evaporation and Chemical Vapor Deposition (CVD), or other suitable processes.

Alternatively, in the embodiments of the present disclosure, the inorganic layer 001 is made of SiNx, while the organic layer 002 is made of at least one of acrylate and epoxy resin. And the inorganic layer 001 may be formed by a Thin Film Package Chemical Vapor Deposition (TFE CVD) process, while the organic layer 002 may be formed by the IJP process. Embodiments of the present disclosure are not limited thereto.

Alternatively, in the embodiments of the present disclosure, the device to be packaged 01 may be an OLED device, which is arranged at a display region on the substrate 02. The display region on the substrate 02 is overlaid by both the inorganic layer 001 and the organic layer 002. Further, as shown in FIG. 2, a flexible base layer 03 is formed on the substrate 02. The OLED device is arranged on a corresponding region of the flexible base layer 03 which corresponds to the display region on the substrate 02. And the region of the flexible base layer 03 corresponding to the display region on the substrate 02 is overlaid by both the inorganic layer 001 and the organic layer 002. Specifically, the flexible base layer may be made of Polyimide (PI).

Figure 3:
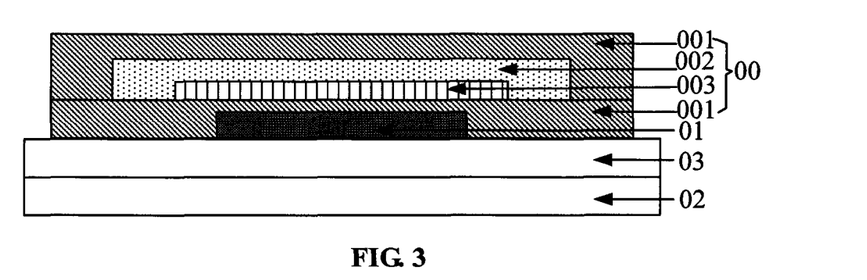
FIG. 3 is a diagram illustrating the arrangement of still another thin film package structure according to embodiments of the present disclosure.

FIG. 3 is a diagram illustrating the arrangement of still another thin film package structure 00 according to embodiments of the present disclosure, in which two inorganic layers and one organic layer arranged therebetween are shown. Alternatively, as shown in FIG. 3, a flexible base layer 03 is formed on a substrate 02. A device to be packaged 01 is formed on the flexible base layer 03. Specifically, the device to be packaged 01 is arranged on a region of the flexible base layer 03 corresponding to a display region (not shown in FIG. 3). It is clear that the device to be packaged 01 is cladded with the inorganic 001, the auxiliary spreading layer 003, the organic layer 002, and the inorganic layer 001 at its outer surface sequentially. Accordingly, the thin film package structure 00 includes the inorganic 001, the auxiliary spreading layer 003, the organic layer 002, and the inorganic layer 001.

Figure 4:
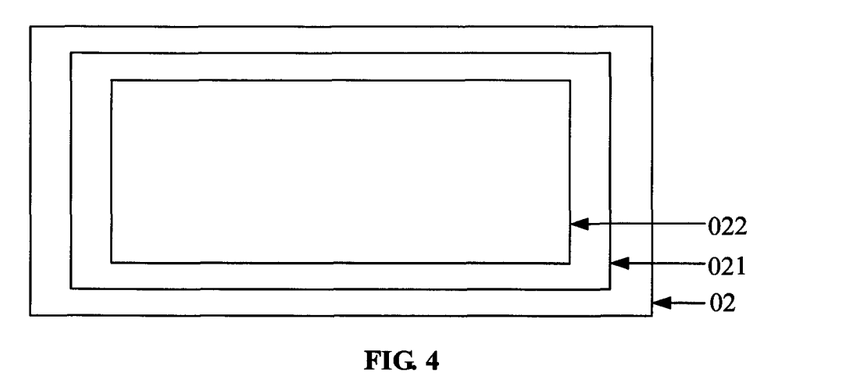
FIG. 4 is a top view illustrating a substrate according to embodiments of the present disclosure.

For example, FIG. 4 is a top view illustrating a substrate 02 according to embodiments of the present disclosure. As shown in FIG. 4, the substrate includes a Pixel Definition Layer (PDL) region 021 and a display region 022. The area of the PDL region 021 is larger than that of the display region 022. In the meantime, the display region 022 is located within the PDL region 021. Also, the display region 022 is referred to as an Active Area (AA). Alternatively, in embodiments of the present disclosure, in a situation where the substrate 02 is applied in FIG. 2, the device to be packaged 01 is arranged at the display region 022 on the substrate 02. The PDL region 021 on the substrate 02 is overlaid by the inorganic layer 001, while the display region 022 on the substrate 02 is overlaid by the organic layer 002. As the display region 022 is located within the PDL region 021, the display region 022 is also overlaid by the inorganic layer 001. However, the embodiments of the present disclosure are not limited thereto. For example, in the case that the device to be packaged 01 is an OLED device, the substrate within its display region 022 includes an Organic Light-Emitting Diode Electro Luminescence (OLED EL) region, where the OLED device is located.

Figure 5:
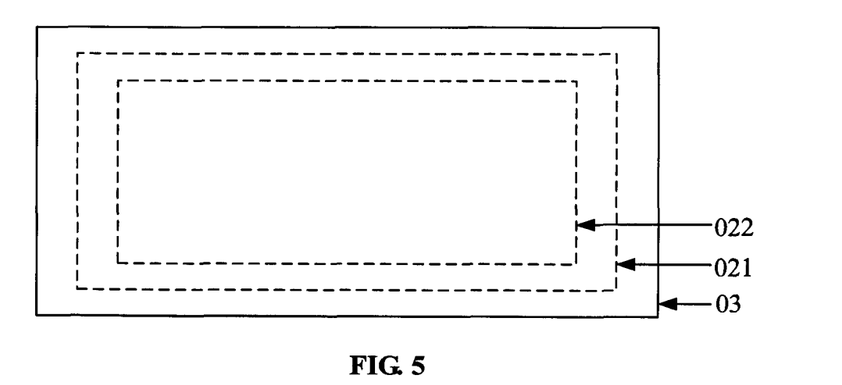
FIG. 5 is another top view illustrating the substrate after a flexible base layer is formed thereon according to embodiments of the present disclosure.

Further, FIG. 5 is a top view illustrating the substrate 02 after a flexible base layer 03 is formed thereon according to embodiments of the present disclosure. As shown in FIG. 5, the substrate 02 is overlaid by the flexible base layer 03. In other words, both the PDL region 021 and the display region 022 on the substrate are overlaid by the flexible base layer 03. Accordingly, the substrate is not shown in FIG. 5, in which both the PDL region 021 and the display region 022 are indicated by broken lines. Alternatively, in embodiments of the present disclosure, in a situation where the substrate 02 having the flexible base layer 03 formed thereon is applied in FIG. 2, the device to be packaged 01 is arranged at a corresponding region of the flexible base layer 03 corresponding to the display region 022 of the substrate. A corresponding region on the flexible base layer 03 corresponding to the PDL region 021 on the substrate is overlaid by the inorganic layer 001, while a corresponding region on the flexible base layer 03 corresponding to the display region 022 on the substrate is overlaid by the organic layer 002. As the display region 022 is located within the PDL region 021, the corresponding region on the flexible base layer 03 corresponding to the display region 022 is also overlaid by the inorganic layer 001. However, the embodiments of the present disclosure are not limited thereto.

Therefore, according to the thin film package structure provided by embodiments of the present disclosure, due to the fact that an auxiliary spreading layer is formed between an inorganic layer and an organic layer and the hydrophilicity-hydrophobicity of the auxiliary spreading layer is the same as that of the organic layer, IJP Ink that is used to form the inorganic layer is apt to spread on the inorganic layer effectively. Therefore IJP Ink is good at spreadability on the inorganic layer and filling effect on cracks and defects on and/or inorganic layers, which results in solving the technical problem of unsatisfactory filling effect on cracks and defects of inorganic layers by means of organic layers, and achieving a much improved filling effect on cracks and defects on inorganic layers by means of organic layers.

Besides, according to the thin film package structure provided by embodiments of the present disclosure, due to the fact of satisfactory filling effect on cracks and defects and/or inorganic layers by means of organic layers, components such as water and oxygen in the air can be effectively isolated from the device to be packaged by means of such a thin film package structure. As a result, the thin film package structure after having the displaying device packaged can prolong life span of the displaying device.

The thin film package structure may be applied to packaging OLED devices which are active lighting devices and prevail in the field of full color display and display illumination. Besides, OLED devices are made of organic materials and their flexible displaying is realized depending on the flexibility of organic materials. As a result, OLED devices are prevailing in the field of flexible displaying. However, $H_2O$ and $O_2$ may impose adverse effect on life span of the OLED devices. Accordingly, quality of package structure and its process directly influence development and advancing of OLED devices. In the related art, the thin film package structure is consisted of inorganic layers and organic layers alternately laminated. And the organic layers are made of IJP Ink, while the inorganic layers are made of SiNx. As a result, polarity of IJP Ink is different from that of SiNx, which results in that hydrophilicity-hydrophobicity of the organic layers is different from that of the inorganic layers too, thereby spreadability of IJP Ink that is used to form organic layers on inorganic layers made of SiNx deteriorates. Accordingly, IJP Ink can hardly fill in cracks and defects existed on the inorganic layers, which results in invalid package of the thin film package structure. As oppose to it, by introducing an auxiliary spreading layer whose hydrophilicity-hydrophobicity is the same as that of organic layers according to embodiments of the present disclosure, interface characteristics of contact interfaces between inorganic layers and organic layers can be improved effectively, such that the interface characteristics of contact interfaces varies from hydrophilicity to hydrophobicity. As a result, IJP Ink has a good spreadability on the inorganic layers, which results in that IJP Ink can better fill in cracks and defects of the inorganic layers, thereby improving its isolation effect of the thin film package structure.

Further, the present disclosure in its embodiments provides a method for fabricating a thin film package structure. The method includes providing a device (i.e., a device to be packaged), arranging a plurality of film layers on the outside of the device, wherein the plurality of film layers includes inorganic layers and organic layers alternately laminated, and wherein the innermost film layer and the outermost film layer among the plurality of film layers are inorganic layers, and arranging an auxiliary spreading layer between at least one pair of inorganic layer and organic layer adjacent to each other among the plurality of film layers, wherein the hydrophilicity-hydrophobicity of the auxiliary spreading layer is the same as that of the organic layer in contact with the auxiliary spreading layer.

Figure 6:
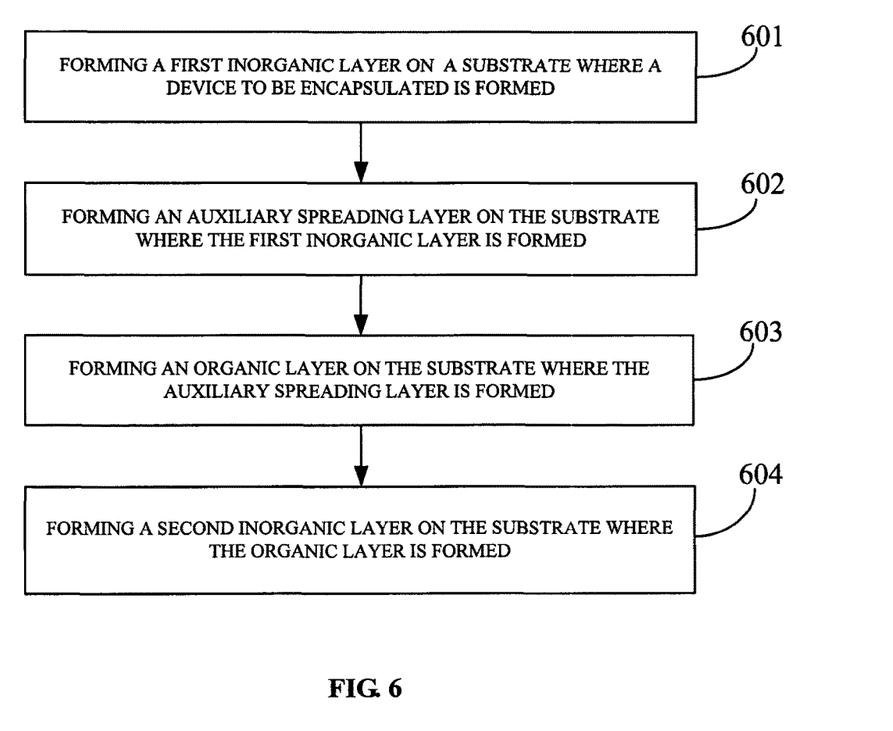
FIG. 6 is a flow chart illustrating a method for fabricating the thin film package structure according to embodiments of the present disclosure.

Specifically, FIG. 6 is a flow chart illustrating a method for fabricating the thin film package structure according to embodiments of the present disclosure. For example, the method is applied to the thin film package structure as shown in FIG. 3. However, the method as shown in FIG. 6 may well be applied to other thin film package structures as shown in FIG. 1 and FIG. 2. As shown in FIG. 6, the method includes steps 601-604.

In step 601, a first inorganic layer is formed on a substrate where a device to be packaged is formed.

Figure 7:
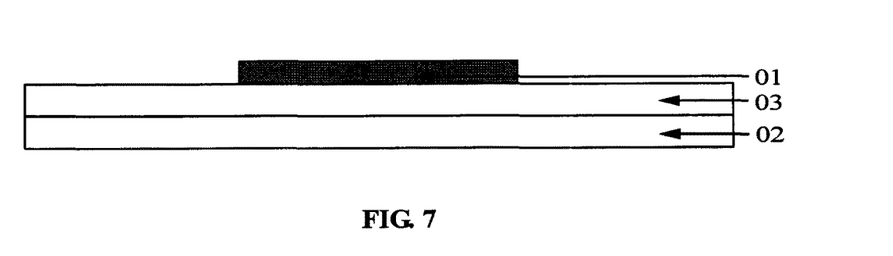
FIG. 7 is a diagram illustrating a structure of the substrate having a device to be packaged formed thereon according to embodiments of the present disclosure.

Specifically, FIG. 7 is a diagram illustrating a structure of the substrate 02 having a device to be packaged formed 01 thereon according to embodiments of the present disclosure. As shown in FIG. 7, a flexible base layer 03 is formed on the substrate 02, whereas the device to be packaged 01 is formed on the substrate 02 having the flexible base layer 03 formed thereon. Specifically, a top view of the substrate 02 is shown in FIG. 4, whereas a top view of the substrate having the flexible base layer 03 formed thereon is shown in FIG. 5. The present embodiment of the present disclosure will not repeat relevant description on them. Further, the device to be packaged 01 is located at a corresponding region of the flexible base layer 03 corresponding to a display region on the substrate 02. In embodiments of the present disclosure, processes for forming the flexible base layer 03 and the device to be packaged 01 can be conventional in the related art, which will not be repeated again.

Figure 8:
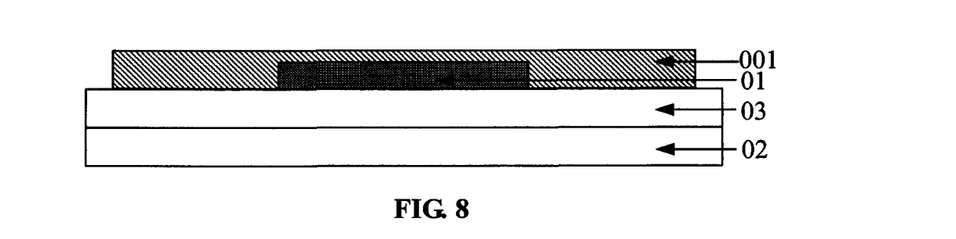
FIG. 8 is a diagram illustrating a structure of the substrate having a device to be packaged formed thereon after a first inorganic layer is formed on the substrate according to a certain embodiment as shown in FIG. 6.
Figure 9:
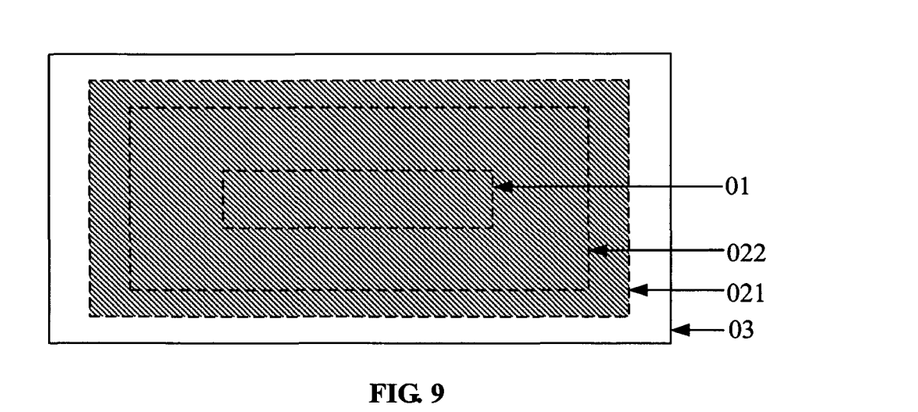
FIG. 9 is a top view illustrating the substrate having a device to be packaged formed thereon after the first inorganic layer is formed on the substrate according to a certain embodiment as shown in FIG. 6.

FIG. 8 is a diagram illustrating a structure of the substrate 02 having a device to be packaged 01 formed thereon after a first inorganic layer 001 is formed on the substrate according to a certain embodiment as shown in FIG. 6. As shown in FIG. 8, the device to be packaged 01 is cladded with the first inorganic layer 001 at its outer surface. FIG. 9 is a top view illustrating the substrate 02 having a device to be packaged 01 formed thereon after the first inorganic layer 001 is formed on the substrate 02 according to a certain embodiment as shown in FIG. 6. As shown in FIG. 9, a corresponding region of the flexible base layer 03 corresponding to the PDL region 021 on the substrate is overlaid by the first inorganic layer. As the substrate is overlaid by the flexible base layer 03 and a corresponding region of the flexible base layer 03 corresponding to the PDL region 021 on the substrate is overlaid by the first inorganic layer, the PDL region 021, the display region 022, and the device to be packaged 01 are all indicated by broken lines.

Specifically, a SiNx layer may be formed by depositing a layer of SiNx on the substrate 02 having the device to be packaged 01 formed thereon by a TFE CVD process. And then the SiNx layer may be processed by one single patterning process, so as to retain SiNx on a corresponding region of the flexible base layer 03 corresponding to the PDL region on the substrate 02, while removing SiNx on other regions, thereby obtaining the first inorganic layer 001. Alternatively, SiNx may also be deposited on a corresponding region of the flexible base layer 03 corresponding to the PDL region directly by the TFE CVD process. The embodiments of the present disclosure are not limited thereto.

It needs to be noted that, in embodiments of the present disclosure, in a situation where the device to be packaged 01 is an OLED device, a cathode of the OLED device is formed by an evaporation process. After forming the cathode of the OLED device, a passivation process is conducted on the OLED device. As a result, the first inorganic layer 001 is formed after the passivation process. In this way, the OLED can be better protected, which will not be elaborated herein.

In step 602, an auxiliary spreading layer is formed on the substrate having the first inorganic layer formed thereon.

Figure 10:
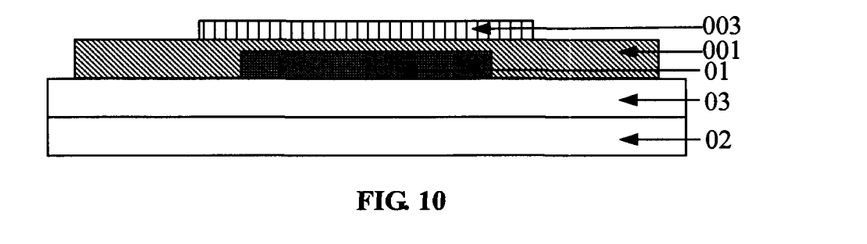
FIG. 10 is a diagram illustrating a structure of the substrate having the first inorganic layer formed thereon after an auxiliary spreading layer is formed on the substrate according to a certain embodiment as shown in FIG. 6.

FIG. 10 is a diagram illustrating a structure of the substrate 02 having the first inorganic layer 001 formed thereon after the auxiliary spreading layer 003 is formed on the substrate 02 according to a certain embodiment as shown in FIG. 6. Specifically, the auxiliary spreading layer 003 may be located at a corresponding region of the first inorganic layer 001 corresponding to the display region on the substrate 02.

Here, the hydrophilicity-hydrophobicity of the auxiliary spreading layer 003 is the same as that of the organic layer to be formed and in contact with the auxiliary spreading layer 003. For example, in a situation where the hydrophilicity-hydrophobicity of the organic layer to be formed and in contact with the auxiliary spreading layer 003 is hydrophobicity, then the hydrophilicity-hydrophobicity of the auxiliary spreading layer 003 is hydrophobicity too. Alternatively, in embodiments of the present disclosure, the auxiliary spreading layer 003 includes a self-assembled non-polar hydrophobic monolayer, such that filming process of the auxiliary spreading layer 003 can be facilitated. Specifically, the auxiliary spreading layer 300 is made of at least one of propyltrichlorosilane, octadecyltrichlorosilane, and methoxy ethoxy silane. Further, a process for forming the auxiliary spreading layer 003 includes at least one of evaporation and CVD. For example, the auxiliary spreading layer 003 may be formed on the substrate 01 having the first inorganic layer 001 formed thereon by using propyltrichlorosilane by an evaporation process.

In step 603, an organic layer is formed on the substrate having the auxiliary spreading layer formed thereon.

Figure 11:
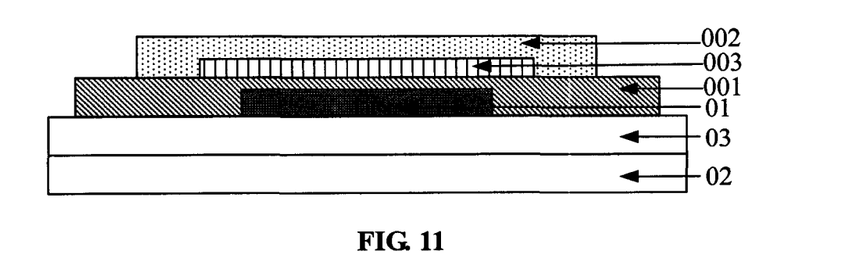
FIG. 11 is a diagram illustrating a structure of the substrate having the auxiliary spreading layer formed thereon after an organic layer is formed on the substrate according to a certain embodiment as shown in FIG. 6.
Figure 12:
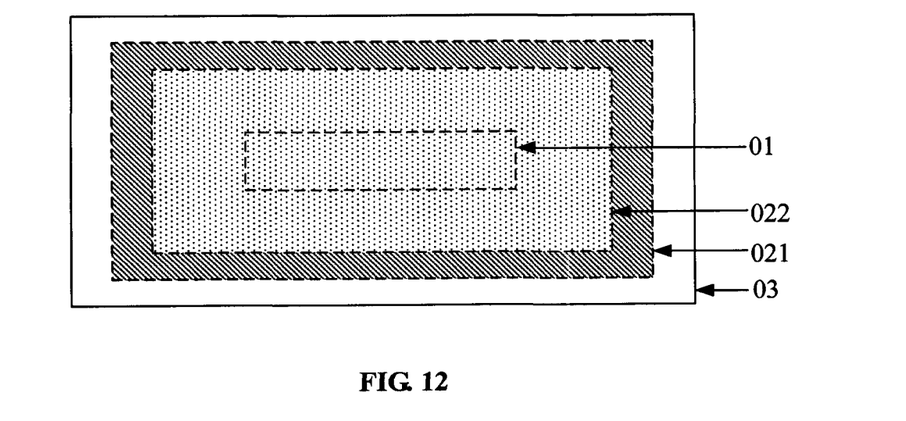
FIG. 12 is a top view illustrating the substrate having the auxiliary spreading layer formed thereon after the organic layer is formed on the substrate according to a certain embodiment as shown in FIG. 6.

FIG. 11 is a diagram illustrating a structure of the substrate 02 having the auxiliary spreading layer 003 formed thereon after an organic layer 002 is formed on the substrate 02 according to a certain embodiment as shown in FIG. 6. As shown in FIG. 11, the organic layer 002 is located outside of the auxiliary spreading layer 003, and is contact with the first inorganic layer 001. FIG. 12 is a top view illustrating the substrate 02 having the auxiliary spreading layer 003 formed thereon after the organic layer 002 is formed on the substrate 02 according to a certain embodiment as shown in FIG. 6. As shown in FIG. 12, a corresponding region of the flexible base layer 03 corresponding to the display region 022 on the substrate is overlaid by the organic layer.

Specifically, the organic layer 002 may be formed on the substrate 02 having the auxiliary spreading layer 003 formed thereon by using materials such as acrylate and epoxy resin by an IJP process. As shown in FIG. 11, its surface of the organic layer 002 is in contact with the first inorganic layer 001. The polarity of IJP Ink is different from that of SiNx, which results in that hydrophilicity-hydrophobicity of IJP Ink is different from that of SiNx too, thereby enabling IJP Ink to stop effectively on the first inorganic layer 001 and preventing IJP Ink from occurrence of overflowing (namely, IJP Ink overflows from a corresponding region of the first inorganic layer 001 corresponding to the display region on the substrate).

In step 604, a second inorganic layer is formed on the substrate having the organic layer formed thereon.

Specifically, a diagram illustrating the arrangement of the substrate 02 having the organic layer 002 formed thereon after the second inorganic layer is formed on the substrate is shown in FIG. 3, and its corresponding top view is shown in FIG. 9. A process for forming the second inorganic layer may be found at the process for forming the first inorganic layer in step 601, which will not be repeated herein again.

As such, according to the method for fabricating a thin film package structure provided by embodiments of the present disclosure, due to the fact that an auxiliary spreading layer is formed between an inorganic layer and an organic layer and the hydrophilicity-hydrophobicity of the auxiliary spreading layer is the same as that of the organic layer, IJP Ink that is used to form the organic layer is apt to spread on the inorganic layer effectively. Therefore IJP Ink is good at spreadability on the inorganic layer and filling effect on cracks and defects on and/or in inorganic layers, which results in solving the technical problem of unsatisfactory filling effect on cracks and defects on and/or in inorganic layers by means of organic layers, and achieving a much improved filling effect on cracks and defects on and/or in inorganic layers by means of organic layers.

Besides, according to the method for fabricating a thin film package structure provided by embodiments of the present disclosure, due to the fact of satisfactory filling effect on cracks and defects on and/or in inorganic layers by means of organic layers, components such as water and oxygen in the air can be effectively isolated from the device to be packaged by means of such a thin film package structure. As a result, the thin film package structure after having the displaying device packaged can prolong life span of the displaying device.

Further, another embodiment of the present disclosure provides a display device. The display device includes any of the thin film package structures 00 as shown in FIG. 1 through FIG. 3. Herein, the display device may be not only a display panel, but a display device having the display panel. Specifically, the display device may be any product or component with a display function, such as a liquid crystal panel, a liquid crystal TV, a liquid crystal display, an Organic Light-Emitting Display (OLED) panel, an OLED display device, a digital photo frame, an electronic paper (E-paper), a mobile phone, a tablet, and so forth.

As such, according to the display apparatus provided by embodiments of the present disclosure, due to the fact that an auxiliary spreading layer is formed between an inorganic layer and an organic layer within a thin film package structure and its hydrophilicity-hydrophobicity of the auxiliary spreading layer is the same as that of the organic layer, IJP Ink that is used to form the organic layer is apt to spread on the inorganic layer effectively. Therefore IJP Ink is good at spreadability on the inorganic layer and filling effect on cracks and defects on and/or in inorganic layers, which results in solving the technical problem of unsatisfactory filling effect on cracks and defects on and/or in inorganic layers by means of organic layers, and achieving a much improved filling effect on cracks and defects on and/or in inorganic layers by means of organic layers.

Besides, according to the display device having a thin film package structure provided by embodiments of the present disclosure, due to the fact of satisfactory filling effect on cracks and defects on inorganic layers by means of organic layers, components such as water and oxygen in the air can be effectively isolated from the device to be packaged by means of such a thin film package structure. As a result, the thin film package structure after having the displaying device packaged can prolong life span of the display device and the life span of the display apparatus as well.

The description merely discusses example embodiments of the disclosure and shall not be used to limit the scope of the disclosure. It should be noted that, a person skilled in the art may make improvements and modifications without departing from the principle of the disclosure, and these improvements and modifications shall also fall within the scope of the disclosure.

What is claimed is:
1. A thin film package structure comprising:
   a plurality of film layers arranged on the outside of a device, the plurality of film layers including inorganic layers and organic layers alternately laminated, wherein the innermost film layer and the outermost film layer among the plurality of film layers are inorganic layers; and
   an auxiliary spreading layer arranged between at least one pair of one of the inorganic layers and one of the organic layers adjacent to each other among the plurality of film layers, wherein a hydrophilicity-hydrophobicity of the auxiliary spreading layer is the same as that of the organic layer in contact with the auxiliary spreading layer, and wherein the auxiliary spreading layer includes at least one of propyltrichlorosilane, octadecyltrichlorosilane, and methoxy ethoxy silane.

2. The thin film package structure according to claim 1, wherein the auxiliary spreading layer is formed between a first inorganic layer that is a film layer in contact with the device and a first organic layer that is an organic layer in contact with the first inorganic layer.

3. The thin film package structure according to claim 2, wherein among the plurality of film layers, except for the outermost inorganic layer, each of the inorganic layers in contact with one corresponding organic layer is provided with one an spreading layer at its side far away from the device, wherein the hydrophilicity-hydrophobicity of the auxiliary spreading layers are the same as those of the organic layers in contact with the auxiliary spreading layers.

4. The thin film package structure according to claim 1, wherein a process for forming the auxiliary spreading layer includes at least one of evaporation and Chemical Vapor Deposition (CVD).

5. The thin film package structure according to claim 1, wherein the plurality of film layers includes two inorganic layers and one organic layer arranged therebetween.

6. The thin film package structure according to claim 1, wherein:
an inorganic layer includes SiNx; and
the organic layer includes at least one of acrylate and epoxy resin.

7. The thin film package structure according to claim 1, wherein the device includes an Organic Light-Emitting Diode (OLED) device, which is arranged at a display region on a substrate, and wherein the display region is overlaid by both the inorganic layer and the organic layer.

8. The thin film package structure according to claim 7, wherein:
a flexible base layer is formed on the substrate;
the OLED device is arranged at a corresponding region of the flexible base layer corresponding to the display region; and
the corresponding region of the flexible base layer is overlaid by both the inorganic layer and the organic layer.

9. A display apparatus including the thin film package structure according to claim 1.

10. A method for fabricating a thin film package structure, the method comprising:
providing a device;
arranging a plurality of film layers on the outside of the device, wherein the plurality of film layers includes inorganic layers and organic layers alternately laminated, and wherein the innermost film layer and the outermost film layer among the plurality of film layers are inorganic layers; and
arranging an auxiliary spreading layer between at least one pair of an inorganic layer and an organic layer adjacent to each other among the plurality of film layers, wherein a hydrophilicity-hydrophobicity of the auxiliary spreading layer is the same as that of the organic layer in contact with the auxiliary spreading layer, and wherein the auxiliary spreading layer includes at least one of propyltrichlorosilane, octadecyltrichlorosilane, and methoxy ethoxy silane.

11. The method according to claim 10, further comprising:
forming a first inorganic layer on a substrate where the device is formed;
forming the auxiliary spreading layer on the first inorganic layer;
forming a first organic layer on the auxiliary spreading layer; and
forming a second inorganic layer on the first organic layer.

12. The method according to claim 11, wherein arranging the auxiliary spreading layer comprises:
arranging an auxiliary spreading layer between every pair of the organic layer and the inorganic layer adjacent to each other, wherein the hydrophilicity-hydrophobicity of the auxiliary spreading layer is the same as that of the organic layer in contact with the auxiliary spreading layer.

13. The method according to claim 10, wherein the hydrophilicity-hydrophobicity of the organic layer is hydrophobicity, while the hydrophilicity-hydrophobicity of the auxiliary spreading layer is hydrophobicity.

14. The method according to claim 13, wherein the auxiliary spreading layer includes a self-assembled non-polar hydrophobic monolayer.

15. The method according to claim 10, wherein the device includes an Organic Light-Emitting Diode (OLED) device, which is arranged at a display region on a substrate, and wherein the display region is overlaid by both the inorganic layers and the organic layers alternately laminated.

16. The method according to claim 15, further comprising:
forming a flexible base layer on the substrate;
forming a first inorganic layer on the flexible base layer;
forming the auxiliary spreading layer on the first inorganic layer;
forming a first organic layer on the auxiliary spreading layer; and
forming a second inorganic layer on the first organic layer.

17. A method for fabricating a display comprising the method for fabricating a thin film package structure according to claim 10.

* * * * *